(12) United States Patent
Tang et al.

(10) Patent No.: US 10,571,495 B2
(45) Date of Patent: Feb. 25, 2020

(54) SYSTEMS AND METHODS FOR MONITORING POWER

(71) Applicant: ROCKWELL AUTOMATION TECHNOLOGIES, INC., Mayfield Heights, OH (US)

(72) Inventors: Benfeng Tang, Shanghai (CN); Linglai Li, Shanghai (CN); Xuyuan Xiao, Shanghai (CN); Kun Wei, Shanghai (CN); Phillip Bush, Milwaukee, WI (US); David Bradly Berman, Milwaukee, WI (US); Sean Charles Schmelzer, Milwaukee, WI (US); Steven A. Lombardi, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 271 days.

(21) Appl. No.: 15/631,475

(22) Filed: Jun. 23, 2017

(65) Prior Publication Data

US 2018/0372782 A1 Dec. 27, 2018

(51) Int. Cl.
| | | |
|---|---|---|
| *G06F 11/30* | (2006.01) | |
| *G01R 19/25* | (2006.01) | |
| *H02J 13/00* | (2006.01) | |
| *G01R 22/06* | (2006.01) | |
| *H04B 7/204* | (2006.01) | |
| *G01R 31/371* | (2019.01) | |
| *G01R 21/133* | (2006.01) | |

(52) U.S. Cl.
CPC ....... *G01R 19/2513* (2013.01); *G01R 21/133* (2013.01); *G01R 22/063* (2013.01); *G01R 31/371* (2019.01); *H02J 13/0013* (2013.01); *H04B 7/204* (2013.01); *H01H 2300/03* (2013.01); *H04Q 2209/00* (2013.01)

(58) Field of Classification Search
CPC .................................................... G01R 31/371
See application file for complete search history.

(56) References Cited

U.S. PATENT DOCUMENTS

2013/0166090 A1* 6/2013 Ren ........................... H02J 3/18
                                                              700/297
2015/0331035 A1* 11/2015 Li ......................... G01R 31/086
                                                              702/59

* cited by examiner

*Primary Examiner* — Phuong Huynh
(74) *Attorney, Agent, or Firm* — Fletcher Yoder, P.C.

(57) ABSTRACT

A system includes a plurality of power monitors that, in operation, monitor parameters of power in an automation system at points between loads and/or power sources. Each of the power monitors includes sensing circuitry to sense the power parameters, peer-to-peer communications circuitry to communicate with other power monitors via peer-to-peer communication, network communications circuitry to communicate with automation devices via a network, and functional circuits to perform analysis of monitored power parameters in a cooperative manner based upon the power parameters monitored by the respective power monitor and power parameters monitored by other power monitors communicated via peer-to-peer communication.

20 Claims, 8 Drawing Sheets

| | | |
|---|---|---|
| PM 1 | DOWNSTREAM | 100% |
| PM 2 | DOWNSTREAM | 100% |
| PM 3 | UPSTREAM | 100% |
| PM 4 | UPSTREAM | 100% |
| PM 5 | UPSTREAM | 100% |
| PM 6 | UPSTREAM | 100% |
| PM 7 | UPSTREAM | 100% |

SYSTEMS AND METHODS FOR MONITORING POWER

BACKGROUND

The invention relates generally to monitoring power, for example, in automation systems and/or electrical systems such as power networks.

Many automation and electrical applications rely on power monitoring devices (e.g., power monitors) to perform measurement, control, and diagnostic operations. Typically, to perform these operations, the power monitoring devices in the automation and electrical applications may monitor a single electrical point. However, in cases in which synchronously capturing data from more than one electrical point is desirable, such a setup is not feasible for obtaining synchronous data that can be used to perform real-time control and diagnostic operations.

BRIEF DESCRIPTION

In a first embodiment, a system includes a plurality of power monitors that, in operation, monitor parameters of power in an automation system at points between loads and/or power sources. Each of the power monitors includes sensing circuitry to sense the power parameters, peer-to-peer communications circuitry to communicate with other power monitors via peer-to-peer communication, network communications circuitry to communicate with automation devices via a network, and functional circuits to perform analysis of monitored power parameters in a cooperative manner based upon the power parameters monitored by the respective power monitor and power parameters monitored by other power monitors communicated via peer-to-peer communication.

In another embodiment, a system includes a power monitor that, in operation, monitors parameters of power in an automation system at a point between loads and/or power sources. The power monitor includes sensing circuitry to sense the power parameters, peer-to-peer communications circuitry to communicate with other power monitors via peer-to-peer communication, network communications circuitry to communicate with automation devices via a network, and functional circuits to perform analysis of monitored power parameters in a cooperative manner based upon the power parameters monitored by the respective power monitor and power parameters monitored by other power monitors communicated via peer-to-peer communication.

In yet another embodiment, a method includes monitoring power in an automation system at points between loads and/or power sources via a plurality of power monitors. Each power monitor of the plurality of power monitors includes sensing circuitry to sense the power parameters, peer-to-peer communications circuitry to communicate with other power monitors via peer-to-peer communication, network communications circuitry to communicate with automation devices via a network, and functional circuits to perform analysis of monitored power parameters in a cooperative manner based upon the power parameters monitored by the respective power monitor and power parameters monitored by other power monitors communicated via peer-to-peer communication. The method also includes communicating power data between the power monitors via peer-to-peer communication and controlling or analyzing the monitored power based upon the power data communicated between the power monitors.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Power monitoring devices, such as power monitors, may be used to control and monitor characteristics of electrical systems such as voltage, current, power, frequency, phase sequence, phase angle, and waveform. Typically, a power monitoring device may only be used to monitor a single electrical point in a system. In other words, power monitoring devices may be associated with the same system, but cannot collect synchronous data that is desirable for performing certain measurement, control, and diagnostic operations. The presently disclosed techniques allow for several co-operational power monitoring devices with analytical and control capabilities that run on the same time base (i.e., run synchronously) that may be used to perform real-time measurement, control, and diagnostic operations.

Figure 1:
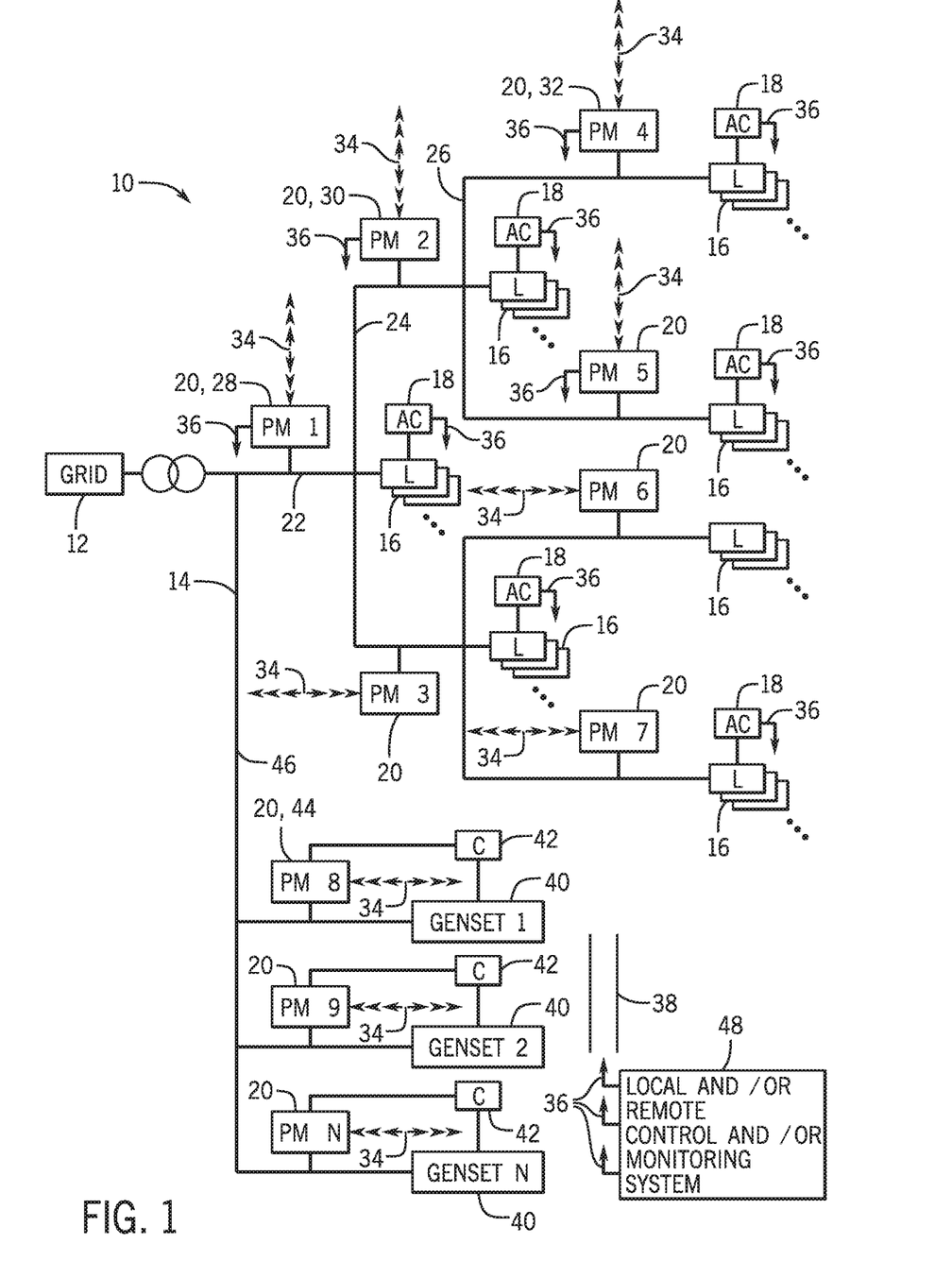
FIG. 1 is a schematic diagram of an automation system, in accordance with embodiments described herein.

By way of introduction, FIG. 1 is a schematic diagram of an automation system 10. The automation system 10 may be linked to a grid 12, which may provide electricity (i.e., electrical power) to the automation system 10. More specifically, the grid may supply alternating current and/or direct current electrical power to the automation system 10. Furthermore, in embodiments in which the grid 12 supplies alternating current electrical power, the electrical power may be, but is not limited to, three-phase electrical power, split-phase electrical power, or two-phase electrical power. The automation system 10 may also include a power network 14 through which the electrical power supplied by the grid 12 may be distributed.

The automation system 10 may also include various loads 16 that may consume the electrical power provided via the power network 14. The loads 16 may include automation devices, such a devices that perform operations of an automated process completed by the automation system 10. Furthermore, the loads 16 may be coupled to (e.g., physically coupled, electrically coupled, or communicatively coupled) and controlled by automation controllers 18. The automation controllers 18 may include a user interface, such as a graphical user interface (GUI) from which a user may control operational parameters of the loads 16.

Additionally, the automation system 10 may include power monitors 20, which may be used to monitor various characteristics and/or parameters of the automation system 10 such as, but not limited to, voltage, current, power, frequency, phase sequence, phase angle, and waveform. More specifically, the power monitors 20 may be used to monitor the automation system 10 at various points of the power network 14. For example, a first point 22, a second point 24, and a third point 26 of the power network 14 may be monitored by a first power monitor 28, a second power monitor 30, and a third power monitor 32, respectively, or by a combination thereof. More specifically, each of the power monitors 20 may monitor the power network 14 at a specific point of the power network 14, and points of the power network 14 located between two loads may be monitored by more than one of power monitors 20. As discussed below, each of the power monitors 20 may operate synchronously and communicate with one or more of the other power monitors 20 in real-time, which allows the power monitors 20 to perform measurement, control and diagnostic operations, such as monitoring the power network 14 in real-time at points between the loads 16. The power monitors 20 may include circuitry that is used to sense data regarding the characteristics and/or parameters of the automation system 10.

The power monitors 20 may perform peer-to-peer (P2P) computing and networking via P2P communication 34. That is, each of the power monitors 20 may be part of a P2P network and conduct P2P communication 34 to share data and/or processing power with other power monitors 20. For example, as discussed below, one or more of the power monitors 20 may include circuitry that enables P2P communication 34, programming (e.g., computer instructions) that provides for measurement, control, and diagnostic operations, and processing circuitry that may execute such programming.

In addition to P2P communication 34, the power monitors may also perform network communication 36 via a network 38. The network 38 may be wired or wireless. The power monitors 20 may communicate via the network 38 with a control and/or monitoring system 48, which may receive data from the power monitors 20 as well as send commands to the power monitors 20. In other words, the control and/or monitoring system 48 may include circuitry that allows the control and/or monitoring system 48 to make determinations using the data received from the power monitors 20 and control the power monitors 20 based on such determinations.

The automation system 10 may also be supplied with electrical power from sources other than the grid 12. For example, one or more generators 40 may be connected to the power network 14 and supply electrical power to the automation system 10. The generators 40 may be controlled by controllers 42. That is, the controllers 42 may be used to control various operational parameters of the generators 40 such as power output. The controllers 42 may include a user interface (e.g., a GUI) from which a user may control the operational parameters of the generators 40.

The power monitors 20 may also be used to monitor the power network 14 of the automation system 10 at and/or near the generators 40. The power monitors 20 associated with the generators 40 may also be controlled via the controllers 42. Additionally, as discussed below, the power monitors 20 may also be used to make determinations regarding points of the power network 14 that are located in between one or more of the load 16 and one or more of the generators 40. For instance, the power monitors 28, 44 may be used monitor operational parameters of the power network 14 at a point 46 and make determinations related to the point 46. For example, as discussed below, the power monitors 20 may determine that a power quality event, such as a voltage sag, exists in the automation system 10 (e.g., at the point 46).

Figure 2:
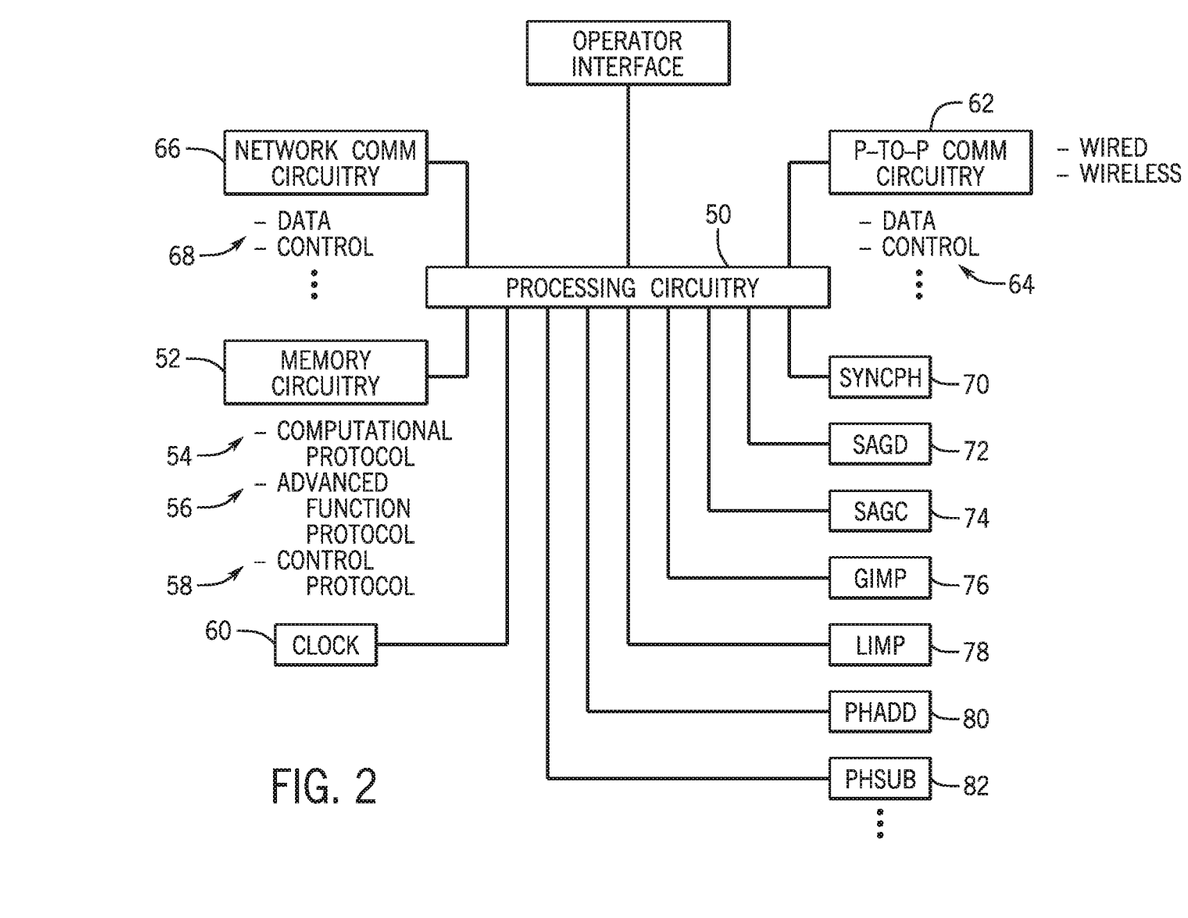
FIG. 2 is a schematic diagram of components that may be included in each of the power monitors of the automation system of FIG. 1, in accordance with embodiments described herein.

Keeping the power monitors 20 in mind, FIG. 2 is a schematic diagram of components that may be included in each of the power monitors 20. The power monitors 20 may include processing circuitry 50 that may execute programming (e.g., software or instructions) that may be stored on memory circuitry 52 to perform the disclosed techniques. The processing circuitry 50 may include one or more microprocessors, "general-purpose" microprocessors, special-purpose microprocessors, application specific integrated circuits (ASICS), or some combination thereof. Additionally, the processing circuitry 50 may be used to interpret and/or make determinations regarding parameters measured by the power monitors 20. For instance, data of parameters may be measured via a sensor that may be associated with the processing circuitry 50, and the processing circuitry 50 make various determinations using the data. As another example, the processing circuitry 50 may also determine a work load for one or more of the power monitors 20 for a given task. That is, the power monitors 20 may use a certain amount of computing or electrical power to perform a task (e.g., make a calculation, power up a load associated with the automation network 10), and the processing circuitry 50 may determine how much of the computing power is or will be supplied by a given power monitor to complete the task and/or how much electrical power will be supplied by a generator associated with a given power monitor 20. Furthermore, the processing circuitry may be coupled to an operator interface (e.g., a GUI) from which an operator may program and/or modify operational characteristics of the power monitors 20.

The memory circuitry 52 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). Moreover, data collected by the power monitors 20 may be stored on the memory circuitry 52.

A computational protocol 54, an advanced function protocol 56, and a control protocol 58 may be stored on the memory circuitry and executed by the processing circuitry 50. The computational protocol 54 may include programming that the processing circuitry 50 may use to perform arithmetic and compare data (e.g., data stored on the memory 52). The computational protocol 54 may also include programming that, when executed, allows the processing circuitry to act as a proportional-integral-derivative (PID) controller. A PID controller may compare data (e.g., operational parameter data of the automation system 10 stored on the memory circuitry 52) to a predetermined value (e.g., a user-selected value) and send commands to the power monitoring devices 20 to make an adjustment (e.g., based on differences between the data and the predetermined value).

The advanced function protocol 56 may include programming that when executed, allows the processing circuitry 50 to perform vector mathematics. For instance, vector mathematics may be performed on data measured by the power monitors 20 and data that is stored on the memory circuitry 52. As discussed below, the advanced function protocol 56 may also include data regarding other operations that may be performed by the processing circuitry 50 or other circuitry associated with the power monitors 20.

The control protocol 58 may include programming that may be executed by the processing circuitry 50 to perform various operations. For instance, the control protocol may include functional blocks (i.e., programming that allows for specific functions and that may be executed by functional circuits as discussed below) that may utilize data associated with the computational protocol 54, the advanced function protocol 56, or both the computational protocol 54 and the advanced function protocol 56. Such functional blocks are discussed in detail below.

The power monitors 20 may also include a clock 60 that allows for synchronization of the power monitors 20. More specifically, the power monitors 20 may be synchronized in accordance with the Institute of Electrical and Electronics Engineers (IEEE) Standard 1588, which is entitled "IEEE Standard for a Precision Clock Synchronization Protocol for Networked Measurement and Control Systems." Moreover, the clock 60 allows for parameters monitored by the power monitors 20 to be detected synchronously.

Additionally, the power monitors 20 may include P2P communication circuitry 62 that allows for P2P communication (e.g., P2P communication 34) between the power monitors 20. The P2P circuitry 62 may also receive data from other power monitors 20 and cause data to be transmitted to other power monitors 20. More specifically, the P2P circuitry 62 may control which data is transmitted to the processing circuitry 50 and other power monitors 20.

Furthermore, the power monitors 20 may include network communication circuitry 66 that allows the power monitors 20 to communicate via a network (e.g., the network 38) and/or other devices (e.g., control and/or monitoring system 48). The network communication circuitry 66 may allow for wired as well as wireless network communication. Also, the network communication circuitry 66 may receive data from, and transmit data to, other power monitors 20 as well as the control and/or monitoring system 48. More specifically, the network communication circuitry 66 may control which data is transmitted to the processing circuitry 50, other power monitors 20, and the control and/or monitoring system 48. The network communication circuitry 66 may also receive commands from the control and/or monitoring system 48 and execute such commands. For example, the control and/or monitoring system 48 may send a command via the network 38 to the network communication circuitry 66 of a power monitor 20 to transmit certain data to another one of the power monitors 20, and the network communication circuitry 66 may send such data to the other power monitor 20.

The power monitors 20 may also utilize several functional circuits that may execute various functional blocks, which may include software or programming that allow for functions to be performed. It should be noted that each of the functional blocks discussed below in association with functional circuits may be stored in the memory circuitry 52 and/or a separate location (e.g., different memory circuitry). A synchrophasor data functional circuit 70 may execute a synchrophasor data functional block to generate synchrophasor data in accordance with IEEE Standard C37.118.1a-2014 (entitled "IEEE Standard for Synchrophasor Measurements for Power Systems—Amendment 1: Modification of Selected Performance Requirements"). Using data from the clock 60, which may serve as a common time source for synchronization with the synchrophasor data functional block, the synchrophasor data functional circuit 70 of the power monitors 20 may allow for real-time measurements of multiple points of the power network 14. Additionally, the synchrophasor data functional block may be associated with the control protocol 58.

The power monitors 20 may also include a voltage sag cause functional circuit 72 as well as a voltage sag direction functional circuit 74 that execute a voltage sag cause functional block and a voltage sag direction functional block, respectively. A voltage sag is a voltage decrease that lasts for a relatively short duration (e.g., a half-cycle to one minute). Voltage sags may be caused, for example, from powering up one of the loads 16 of the automation system 10. The voltage sag cause functional block may be utilized to determine the cause of a voltage sag, and the voltage sag direction functional block may be used to determine the direction of a voltage sag relative to a power monitor 20 (e.g., upstream or downstream). It should also be noted that the voltage sag cause functional block and the voltage sag direction functional block may be associated with the control protocol 58. Additionally, a more in-depth description of the voltage sag cause functional block and the voltage sag direction functional block may be found below in the discussion regarding FIGS. 6-8.

The power monitors 20 may also include a grid impedance functional circuit 76 and a line impedance functional circuit 78 that execute a grid impedance functional block and a line impedance functional block, respectively, in order to determine a grid impedance and a line impedance, respectively, associated with the automation system 10. As used herein, line impedance refers to an impedance between two or more of the power monitors 20. The grid impedance functional block and the line impedance functional block may be associated with the control protocol 58. The grid impedance functional block and the line impedance functional block are discussed below in more detail with regard to FIG. 4 and FIG. 5.

Moreover, the power monitors 20 may include a phasor addition operation functional circuit 80 and a phasor subtraction operation functional circuit 82 that execute a phasor addition operation functional block and a phasor subtraction operation functional block, respectively. The phasor addition operation functional block and the phasor subtraction operation functional block allow for the addition and subtraction of phasors to be performed.

Additionally, while the present discussion relates various functional circuits (e.g., synchrophasor data functional circuit 70) that may execute various functional blocks, it should be noted that the processing circuitry 50 may execute each of the functional blocks in addition, or in the alternative, to the functional circuits. For instance, the processing circuitry 50 may execute that the synchrophasor data functional block alone or in conjunction with the synchrophasor data functional circuit 70.

It should be noted that the processing circuitry 50 and/or the power monitors 20 may include other functional circuits that may utilize other functional blocks. For instance, a data consuming functional block and a data producing functional block may be associated with the computational protocol 54 the advanced function protocol 56, and/or the P2P circuitry 62. Both the data consuming functional block and the data producing functional block are discussed in more detail below with regard to FIG. 4. As another example, there may also be other functional blocks associated with other power quality events, such as a voltage swell events. Voltage swell is a momentary increase in voltage that may occur, for example, when a load is powered down. For instance, the power monitors 20 may include a voltage swell cause functional block as well as a voltage swell direction functional block that may be used to determine the cause and/or direction of a voltage swell relative to each of the power monitors. Given that a voltage sag is a brief decrease in voltage and a voltage well is a brief increase in voltage, it should also be noted that the voltage swell direction functional block and the voltage swell cause functional block may be rather similar to the voltage sag direction functional block 72 and the voltage sag cause functional block 74, respectively.

Figure 3:
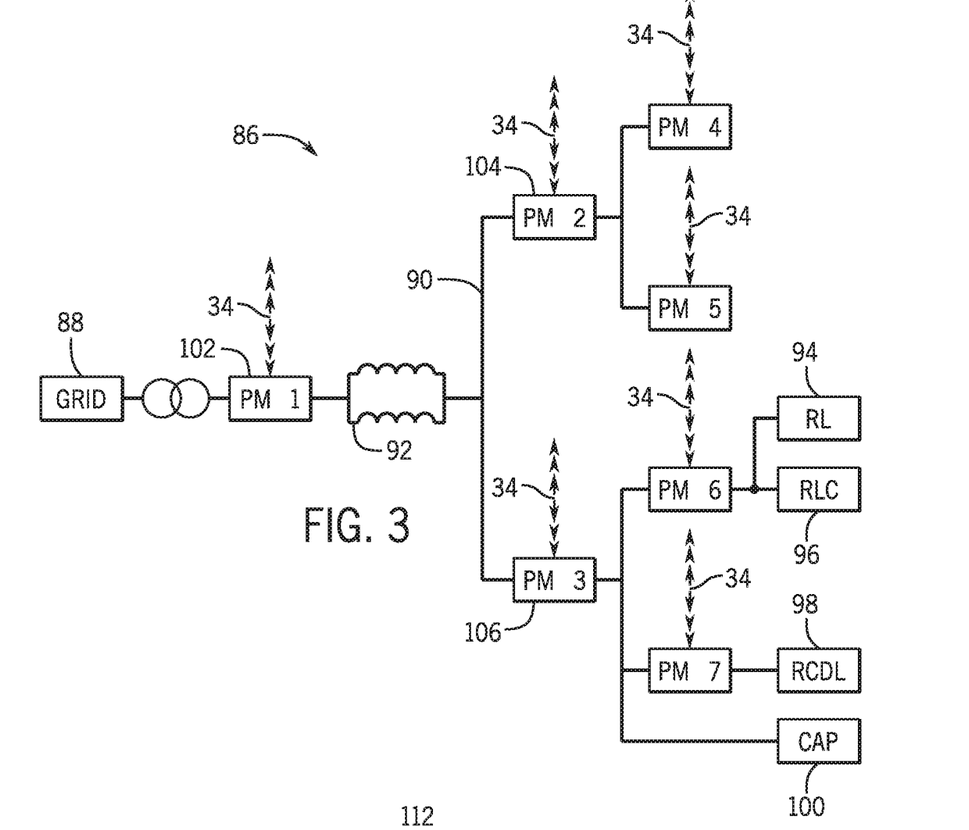
FIG. 3 is a schematic diagram of an automation system, in accordance with embodiments described herein.

Continuing with the drawings, FIG. 3 is a schematic diagram of an automation system 86. The automation system 86 includes a grid 88, which like the grid 12, may supply power (e.g., direct current or alternating current electrical power) to a power network 90 of the automation system 86. The automation system 86 may also include an inductor 92, which may store electrical energy from the grid 88 in a magnetic field while the electricity from the grid 88 runs through the inductor 92.

Additionally, the automation system 86 may include various loads. For instance, the automation system 86 may include a resistive load 94 (e.g., a light bulb). The automation system 86 may also include an RLC load 96, which includes a resistor, inductor and capacitor. Additionally, the automation system 86 may include a residual-current device load 98, which is also known as a ground fault circuit interrupter or a ground fault interrupter. The residual-current device load 98 may instantly break an electrical circuit (e.g., the power network 90) if a predefined condition is met. Furthermore, the automation system 86 may include a capacitive load 100, which, for example, may include a synchronous motor and/or capacitors. It should also be noted that the automation system 86 may include inductive loads, such as induction motors (e.g., a three-phase induction motor).

Furthermore, the automation system 86 may include power monitors that may utilize P2P communication 34 to communicate with one another in the manner described above in relation to the power monitors 20. More specifically, the power monitors of FIG. 3 may be the same as the power monitors 20 of FIG. 1. For instance, the power monitors of FIG. 3 may include each of the components discussed in FIG. 2, and a first power monitor 102, second power monitor 104, and third power monitor 106 may share synchronous, real-time data with one another and determine a line impedance of any two points of the power network 90 that are monitored by the power monitors 102, 104, 106.

Figure 4:
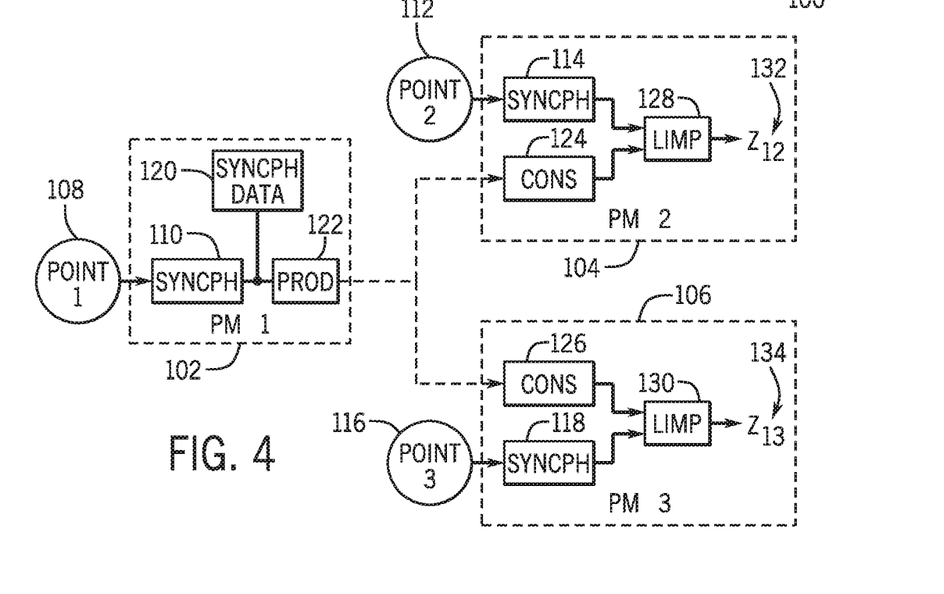
FIG. 4 is a schematic diagram of a portion of the automation system of FIG. 3, in accordance with embodiments described herein.

With this in mind, FIG. 4 is a schematic diagram of a portion of the automation system 86 on which the line impedance functional block may be utilized. The power monitor 102 may monitor power at a first point 108 (e.g., a first point of the power network 90). Data collected from the power monitor 102 may be utilized by a synchrophasor data functional circuit 110. Additionally, the power monitors 104, 106 may collect data regarding a second point 112 and a third point 116, respectively, and the data collected by the power monitors 104, 106 may be utilized by synchrophasor data functional circuits 114, 118, respectively. As discussed above with regard to the synchrophasor data functional circuit 70, the synchrophasor data functional circuits 110, 114, 118 may execute the synchrophasor data functional block in order to calculate synchrophasor data. In other words, the execution of the synchrophasor data functional block by the synchrophasor data functional circuits allows for the data collected by the power monitors 102, 104, 106 to be synchronous.

Synchrophasor data 120, which refers to data synchronous data collected by the power monitor 102, may be sent to the power monitors 104, 106 via P2P communication using the data producing functional circuit 122. The data producing functional circuit may be included in other circuitry such as P2P communication circuitry 62, and may execute a data producing functional block. More specifically, the data producing functional block, when executed, may cause the data producing functional circuit 122 to transmit the synchrophasor data 120 to data consuming functional circuits 124, 126 of the power monitors 104, 106. More specifically, the data consuming functional circuits 124, 126, which may also be included in the P2P communication circuitry 62, may execute a data consuming functional block that causes the received synchrophasor data 120 to be sent to another component of the power monitors 104, 106. For instance, the synchrophasor data 120 and data measured by the power monitor 104 may be utilized by a line impedance functional circuit 128 to determine an impedance 132 between the first point 108 and the second point 112. Additionally an impedance 134 between the first point 108 and the third point 114 may be determined by a line impedance functional circuit 130 that may utilize the synchrophasor data 120 and data measured by the power monitor 106. More specifically, the line impedance functional circuits 128, 130 may utilize a line impedance functional block in order to determine the impedances 132, 134. More specifically, the line impedance functional block may include programming, that when executed by the line impedance functional circuits 128, 130, causes the line impedance functional circuits 128, 130 to calculate the impedances 132, 134. For example, the line impedance functional block may include formula 1 and formula 2 (shown below), which may be used to determine the impedances 132, 134, respectively, when the impedances of the power monitors 106, 104, respectively, are zero:

$$Z_{12} = \frac{V_{PM1} - V_{PM2}}{I_{PM2}} \quad \text{Formula 1}$$

$$Z_{13} = \frac{V_{PM1} - V_{PM3}}{I_{PM3}} \quad \text{Formula 2}$$

where $Z_{12}$ is the impedance 132, $V_{PM1}$ is the voltage measured by the power monitor 102, $V_{PM2}$ is the voltage measured by the power monitor 104, $I_{PM2}$ is the impedance of the power monitor 104, $Z_{13}$ is the impedance 134, $V_{PM3}$ is the voltage measured by the power monitor 106, and $I_{PM3}$ is the impedance of the power monitor 106.

Figure 5:
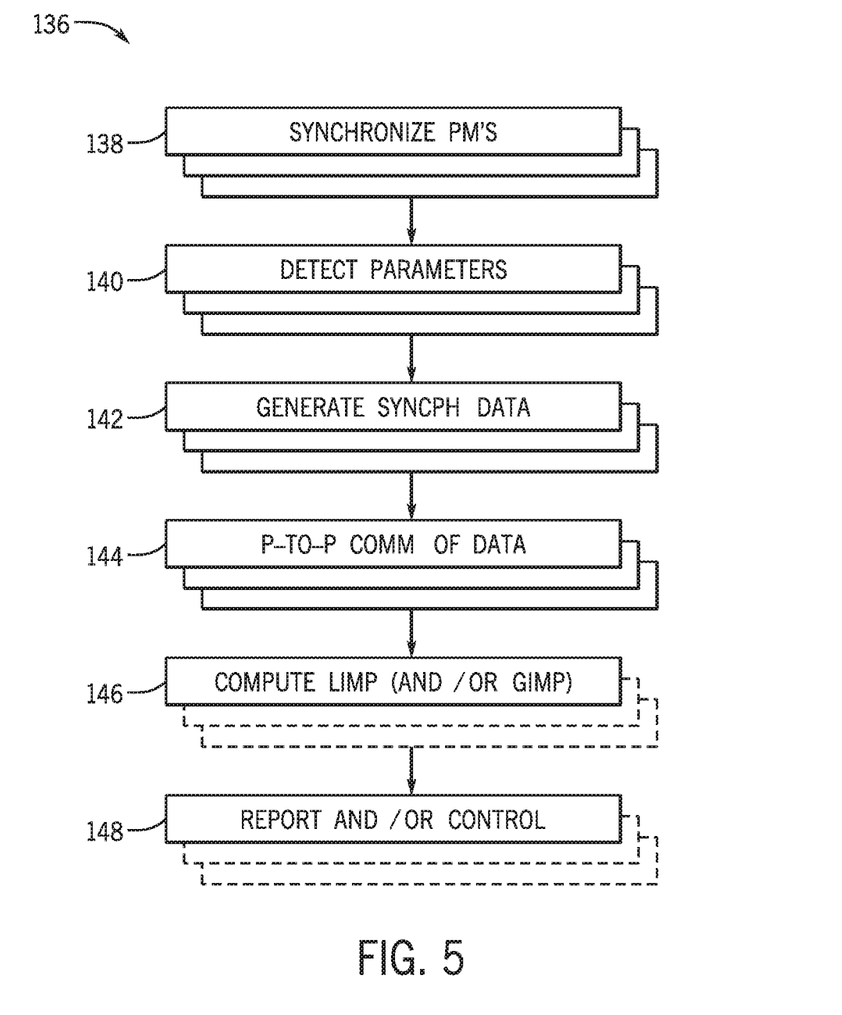
FIG. 5 is a flow chart of a method for determining line impedance and/or grid impedance, in accordance with embodiments described herein.

With this in mind, FIG. 5 is a method 136 for determining line impedance and/or grid impedance. The method 136 may be performed by each of the power monitors 20 alone or in combination with other power monitors 20. More specifically, the method 136 may be performed by one or more processors (e.g., processing circuitry 50) that may receive data from power monitors (e.g., power monitors 102, 104, 106).

At block 138, power monitors may be synchronized. As explained above, each power monitor may include a clock (e.g., clock 60) that allows for the synchronous collection of data regarding operating parameters of a system in which the power monitors are a part.

At block 140, the parameters of the system in which the power monitors are included are detected. For example, the power monitors may detect, among other things, a voltage, current, and power at a given point in the system. More specifically, the power monitors may include sensing circuitry that allows for the parameters of the system to be measured.

At block 142, the power monitors may generate synchrophasor data. Synchrophasor data is synchronous data regarding the detected parameters of the system. For example, the synchrophasor data may include synchronous voltage, current, and power measurement data.

At block 144, the synchronous data may be communicated via P2P communication. As explained above, the power monitors may include P2P communication circuitry that allows for the transmission and receiving of data to and from other power monitors. Additionally or alternatively, the synchronous data may be communicated via a network (e.g., a wired network or a wireless network). For instance, the power monitors may transmit data to another device (e.g., control and/or monitoring system 48), which may receive the synchronous data and transmit the synchronous data to other power monitors.

At block 146, one or more of the power monitors may compute a line impedance (i.e., an impedance between two points in a power network) and/or a grid impedance. More specifically, synchrophasor data from the power monitors may be used by processing circuitry and/or functional circuitry (e.g., line impedance functional circuit 78 and grid impedance functional circuit 76) in the power monitors that execute functional blocks (e.g., line impedance functional block and grid impedance functional block). For instance, execution of the line impedance functional block may cause the line impedance functional circuit to determine an impedance between two points monitored by power monitors using Formula 1.

At block 148, the line impedance and/or grid impedance may be reported (e.g., via a user interface or a computer monitor) and/or used to control the system in which the power monitors are located. For example, a line impedance value calculated at block 146 may be displayed via a GUI associated with one of the power monitors or the system in which the power monitor is used. Furthermore, based on the determined line impedance, one or more controllers (e.g., automation controllers 18 or controllers 42) may adjust operational parameters of the loads or generators in the system. For example, one or more of the power monitors may transmit the line impedance value via a network (e.g., network 38) to a control and/or monitoring system (e.g., control and/or monitoring system 48), and the control and/or monitoring system may transmit the line impedance value to one or more of the controllers via the network. The controllers may include memory that includes instructions on actions to cause the load with which the controllers are associated to take in response to a computed line impedance value (e.g., power down). Such instructions may also be stored on the network. It should be noted that while this example uses line impedance, the same tasks may be undertaken with regard, and in response to, a computed grid impedance value.

Figure 6:
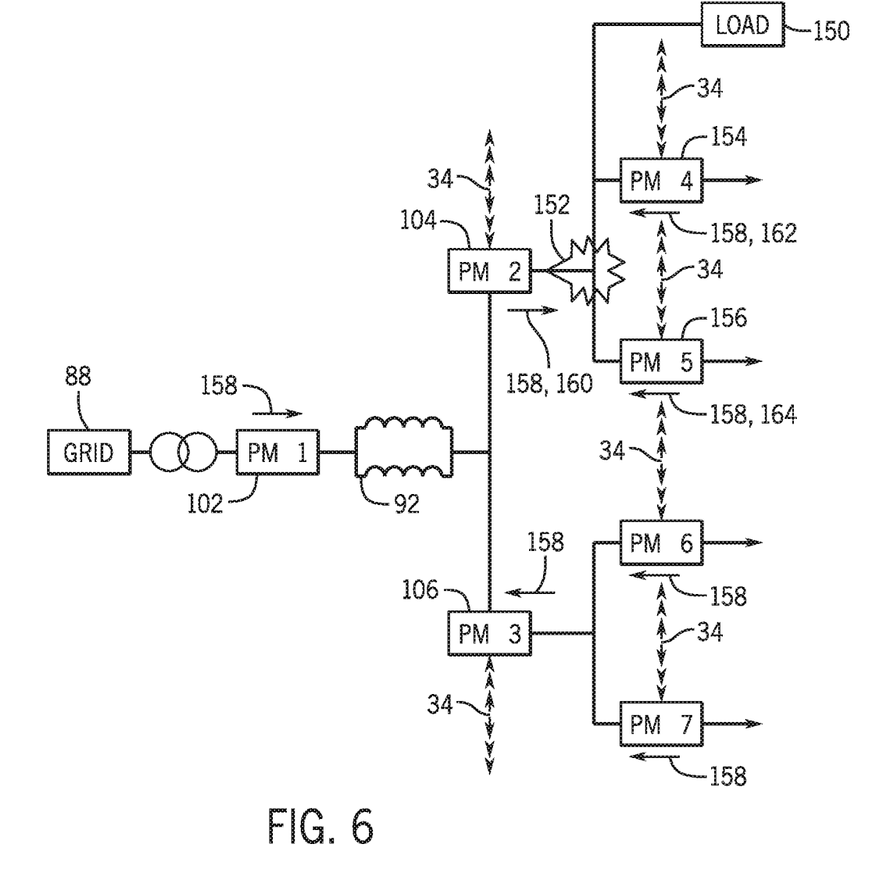
FIG. 6 is a schematic diagram of the automation system of FIG. 3 experiencing a power quality event, in accordance with embodiments described herein.

FIG. 6 is a schematic diagram of an automation system of experiencing a power quality event (e.g., a voltage sag event or a voltage swell event). More specifically, the automation system of FIG. 6 is the same as the automation system 86 of FIG. 3 except for the loads. More specifically, the automation system of FIG. 6 may not include the resistive load 86, RLC load 96, residual-current device load 98, or the capacitive load 100, but the automation system may include a load 150. The load 150 may be a heavy load that causes the automation system to experience a voltage sag event in a location 152 of the automation system. However, it should be noted that voltage sag events may also be caused by an electrical fault such as a short circuit (i.e., a line-to-line fault) and/or a ground fault (i.e., a line-to-ground fault).

Each of the power monitors, which may be the same as the power monitors 20 of FIG. 1 and the power monitors of the automation system 86, via processing circuitry and/or functional circuitry, may execute functional blocks to determine a voltage sag direction 158 relative to each power monitor (e.g., upstream or downstream) as well the location 152 of the voltage sag event. For example, a voltage sag event may occur at the location 152, and the power monitor 104, via execution of the voltage sag direction functional block, may determine that the location 152 has a direction 158 that is downstream of the power monitor 104. Continuing with this example, power monitors 154, 156 may also execute the voltage sag direction functional block, which may cause the power monitors 154, 156 to determine that the location 152 of the voltage sag event has a direction 162, 164 that is upstream of the power monitors 154, 156.

Based on the determination of the voltage sag directions 158, the location 152 of the voltage sag event may be determined by processing circuitry and/or functional circuitry that executes the voltage sag location functional block. The voltage sag location functional block may include instructions such that when executed, power monitors (e.g., power monitors 104, 154, 158) may determine the location 152 of the voltage sag event. Continuing with the example from the preceding paragraph, the location 152 may be determined because the power monitor 104 indicated that the location 152 is downstream of the power monitor 104 and that the power monitors 154, 156 indicated that the location 152 is upstream of the power monitors 154, 156. In other words, the voltage sag location functional block may include instructions to determine the location 152 based on the results of executing the voltage sag direction functional block.

Additionally, the location 152 of the voltage sag event may be indicative the cause of the voltage sag event. For instance, a power monitor may include instructions to determine the cause of the voltage sag event based on the determined location 152 of the sag event. For instance, a power monitor may determine that the voltage sag event of FIG. 6 was caused by the load 150.

Figure 7:
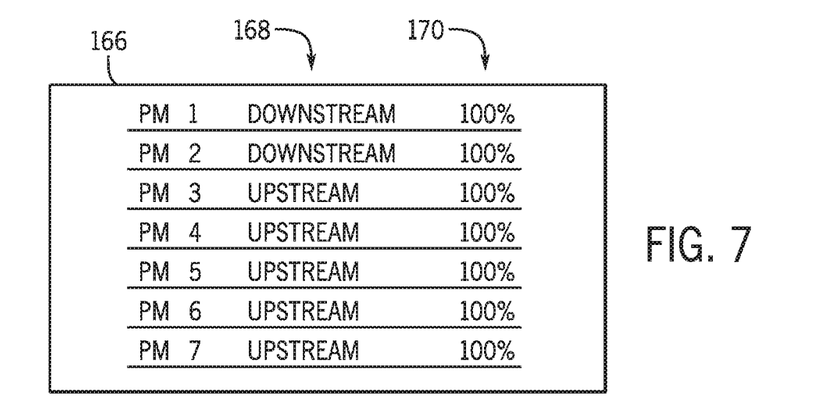
FIG. 7 is a diagram of an output indicating the direction of a voltage sag location relative to power monitors in an automation system, in accordance with embodiments described herein.

Keeping the discussion of FIG. 6 in mind, FIG. 7 is a diagram of an output 166 indicating the direction of the voltage sag location 152 relative to power monitors of an automation system (e.g., power monitors of the automation system of FIG. 6). The output 166 may be generated as a result of execution of the voltage sag direction functional block. For example, each power monitor may determine whether the voltage sag event location 152 is upstream or downstream of the power monitor as well as a probability regarding the correctness of the determined direction. The power monitor may communicate the results to other power monitors (e.g., via P2P communication 34) or a control and/or monitoring system (e.g., via a network). The power monitors and/or the control and/or monitoring system may access instructions (e.g., instructions stored on memory of the power monitors or on the network) that cause the output 166 to be generated as well as transmitted to, and displayed on, the power monitors (e.g., via an operator interface), the control and/or monitoring device (e.g., via a GUI), and/or another device (e.g., a computer monitor).

The output 166 includes a column 168 that indicates the direction of the location 152 of the voltage sag event with respect to a particular power monitor. Additionally, the output includes a second column 170 indicative of the probability of the correctness of the direction indicated in the column 168. The information displayed in the output 166 may be used by users to determine the location 152 of the voltage sag event.

Figure 8:
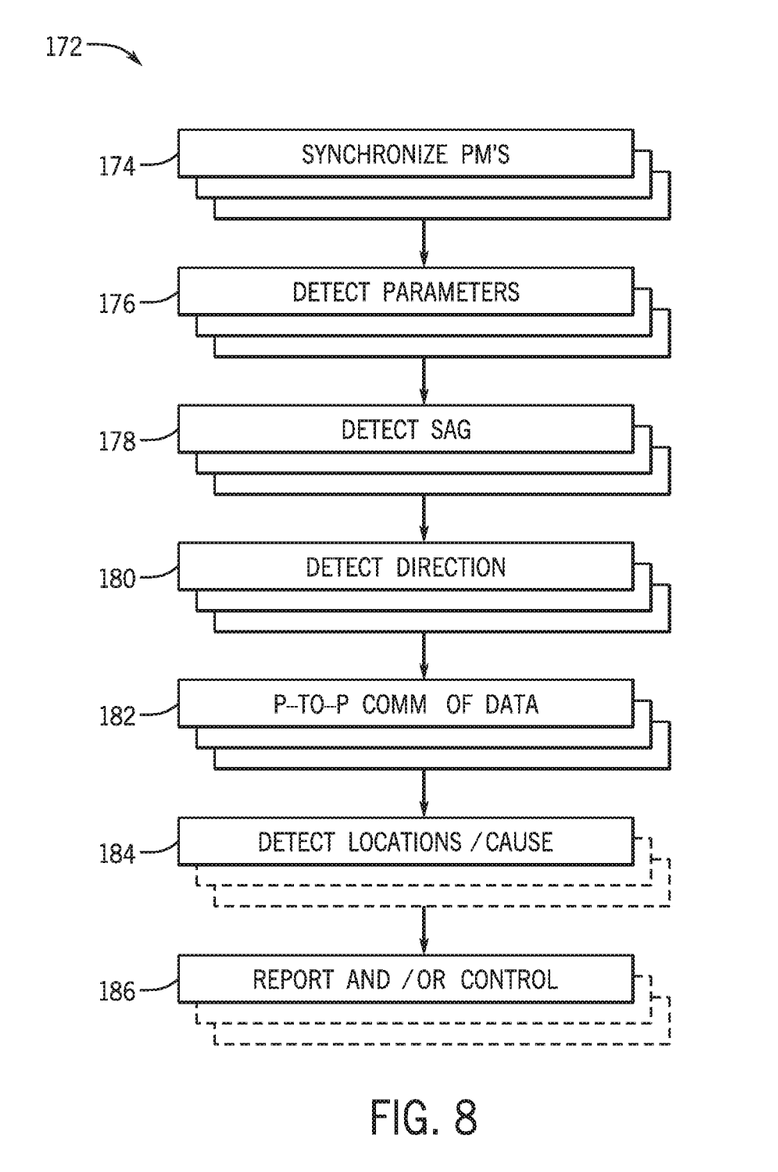
FIG. 8 is a flow chart of a method for determining the location and/or cause of a voltage sag event, in accordance with embodiments described herein.

FIG. 8 is a flow chart of a method 172 for determining the location and/or cause of a voltage sag event. The method 172 may be performed by each of the power monitors alone or in combination with other power monitors. More specifically, the method 172 may be performed by one or more processors that may receive data from power monitors.

At block 174, power monitors may be synchronized. As explained above, each power monitor may include a clock (e.g., clock 60) that allows for the synchronous collection of data regarding operating parameters of a system in which the power monitors are a part.

At block 176, the parameters of the system in which the power monitors are included are detected. For example, the power monitors may detect, among other things, a voltage, current, and power at a given point in the system. More specifically, the power monitors may include sensing circuitry that allows for the parameters of the system to be measured.

At block 178, the power monitors may detect a power quality event (e.g., a voltage sag event). For instance, one or more power monitors may measure a voltages, and processing circuitry of the power monitors may determine that a brief decrease in voltage (i.e., a voltage sag) has occurred.

At block 180, the power monitors may determine a direction of the power monitor relative to a location of the voltage sag event. More specifically, as explained above, each of the power monitors, via processing circuitry and/or voltage sag direction functional circuits, may determine that the location of the voltage sag event is upstream or downstream of the power monitors.

At block 182, data regarding the direction of the location of the voltage sag event relative to one or more of the power monitors may be communicated via P2P communication. As explained above, the power monitors may include P2P communication circuitry that allows for the transmission and receiving of data to and from other power monitors. Additionally or alternatively, the data regarding the direction of the voltage sag event relative to the power monitors may be communicated via a network (e.g., a wired network or a wireless network). For instance, the power monitors may transmit data to another device (e.g., control and/or monitoring system 48), which may receive the synchronous data and transmit the voltage sag direction data to other power monitors.

At block 184, location and/or cause of the voltage sag event may be detected 184. For example, one or more of the power monitors may receive the voltage sag direction data. The power monitor(s), via execution of a voltage sag location functional block by the processing circuitry and/or voltage sag location functional circuit of the power monitor(s), may determine the location of the voltage sag event based on the received voltage sag direction data. Furthermore, the power monitor(s) may determine the cause of the voltage sag event. For instance, referring back to FIG. 6, the power monitor(s) may determine that the voltage sag event was caused by the load 150 based on the determined location 152 of the voltage sag event.

Referring again to FIG. 8, at block 186, the voltage sag directions, voltage sag location, and/or voltage sag cause may be may be reported (e.g., via a user interface or a computer monitor) and/or used to control the system in which the power monitors are located. For example, the output 166 may be generated by a power monitor and displayed via a GUI associated with one of the power monitors or the system in which the power monitors are used. Additionally, the detected location and/or cause of the voltage sag event may be displayed on a GUI (e.g., on a map of an automation system or power network) or another suitable device. Furthermore, based on the determined the voltage sag directions, voltage sag location, and/or voltage sag cause, one or more controllers (e.g., automation controllers 18 or controllers 42) may adjust operational parameters of the loads or generators in a system. For example, one or more of the power monitors may transmit the data reflecting the voltage sag directions, voltage sag location, and/or voltage sag cause via a network (e.g., network 38) to a control and/or monitoring system (e.g., control and/or monitoring system 48), and the control and/or monitoring system may transmit the data regarding the voltage sag directions, voltage sag location, and/or voltage sag cause to one or more of the controllers via the network. The controllers may include memory that includes instructions on actions to cause the load with which the controllers are associated to take in response to a voltage sag direction, voltage sag location, and/or voltage sag cause (e.g., power down). Such instructions may also be stored on the network. For example, the load 150 may be controlled by a controller, and the controller may cause operational parameters of the load 150 to be changed (e.g., power down) in response to determining the location 152 of the voltage sag event and/or that the load 150 caused the voltage sag event.

Figure 9:
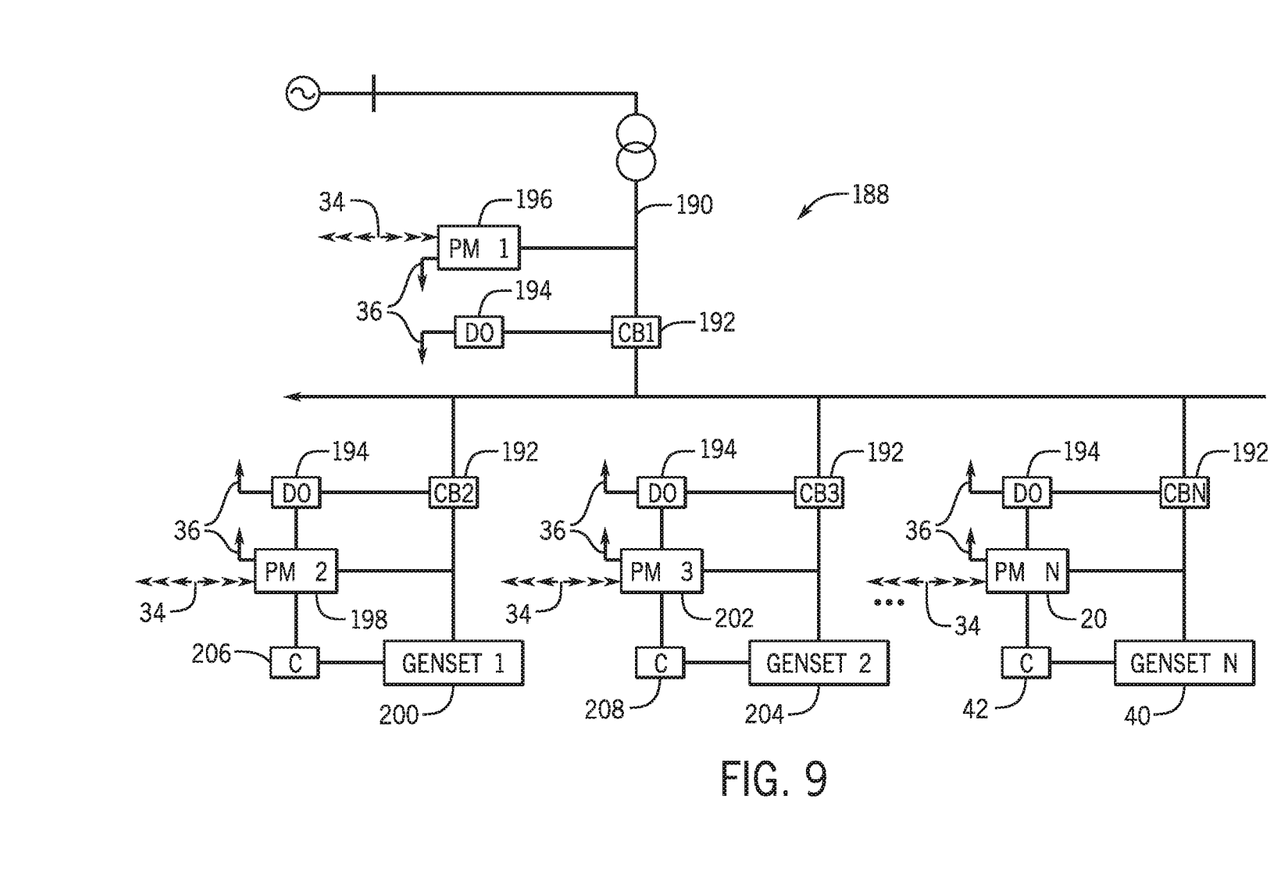
FIG. 9 is a schematic diagram of an automation system, in accordance with embodiments described herein.

FIG. 9 is a schematic diagram of an automation system 188. The automation system 188 may include a power network 190, which may distribute electrical power (e.g., alternating current or direct current electrical power) to and from devices connected to the power network 190. The automation system 188 may include circuit breakers 192, which may prevent electrical power to pass through the circuit breakers 192. The automation system may also include discrete output devices 194, which may output discrete digital signals (e.g., via network communication 36). For example, the discrete output devices 194 may output signals that cause the circuit breakers 192 to connect or disconnect generators 200, 204, 40 to the power network 190.

The automation system 188 may also include power monitors 196, 198, 202, which may monitor parameters of the power network 190 such as, but not limited to, voltage, current, power, frequency, phase sequence, phase angle, and waveform. The power monitors 196, 198, 202 may use P2P communication to send and receive data from one another or from any other power monitors 20 in the automation system. That is, the automation system may include any suitable number of power monitors (as indicated by the power monitor 20) which may communicate with one another via P2P communication in the manner described above.

The power monitors 198, 202 may be associated with circuit breakers 192 as well as discrete output devices 194. Also, the power monitors 198, 202 may be electrically coupled to the generators 200, 204 respectively, which may generate electrical power that may be distributed throughout the power network 190. Furthermore, the power monitors 198, 202 and the generators 200, 204 may be coupled to, and controlled by, controllers 206, 208. It should also be noted that each additional power monitor 20 may also be associated with respective circuit breakers 192, discrete output devices 194, controllers 42, and generators 40. The controllers 206, 208, 42 may control operational parameters of the generators 200, 204, 40, respectively. For example, the controllers 206, 208, 42 may include sensors, actuators, and processing circuitry that allow for control of the generators 200, 204, 40, respectively.

Several control applications may be performed on the automation system 188 due to the P2P communication and/or network communication capabilities of the power monitors 194, 198, 202, 20. For example, in cases where the power network 190 and the generators 200, 204, 40 deliver alternating current electrical power, the generators 200, 204, 40 may be synchronized to one of the generators 200, 204, 40 or a grid to which the power network 190 received electrical power. "Synchronization," when used in the context of the generators 200, 204, 40 and/or a grid, refers to matching the frequencies, magnitudes, and phase angles of the generators 200, 204, 40 to the frequency, magnitude, and phase angle of one of the generators 200, 204, 40 or to the grid. The power monitors 194, 198, 202, 20 may detect parameters (e.g., voltage, current, power, frequency, phase sequence, phase angle, waveform) of the automation system 188 and components of the automation system 188 (e.g., generators 200, 204, 40). Data reflective of the parameters detected by each of power monitors 194, 198, 202, 40 may be sent to, and received by, the other power monitors 194, 198, 202, 40 via P2P communication in the manner described above. Additionally, the data reflective of the detected parameters may also be sent to the controllers 206, 208, 42. Based on the received data, the controllers 206, 208, 42 may adjust the operating parameters of the generators 200, 204, 40, respectively. In this manner, the generators 200, 204, 40 may be synchronized to one of the generators 200, 204, 40 and/or a grid. That is, by utilizing data indicative of the parameters of the generators as well as the power network (which may be supplied with electrical power by a grid), the controllers 206, 208, 42 may adjust the parameters of the generators 200, 204, 40 in order to synchronize the generators 200, 204, 40 to one of the generators 200, 204, 40 and/or the grid.

As another example of a control application, power sharing (i.e., load sharing) between the generators 200, 204, 40 may be achieved. A load may use a certain amount of electrical power, and each of the generators 200, 204, 40 may provide the electrical power the load uses. More specifically the amount of power that each of the generators 200, 204, 40 is to generate for a given load (i.e., power sharing or load sharing), may be determined based on the parameters detected by the power monitors 198, 202, 20.

As discussed above, the power monitors 196, 198, 202, 20 may detect parameters associated with the automation system 188 as well as components of the automation system 188 such as the generators 200, 204, 40 and loads (e.g., automation devices). Data reflective of the parameters may be sent from each of the power monitors 196, 198, 202, 20 to the other power monitors 196, 198, 202, 20 as well as to the controllers 206, 208, 42. The controllers 206, 208, 42 may change operational parameters of the generators (e.g., electrical power output) based on the received data. For example, the data may be indicative of the generator 200 producing more electrical power than the other generators 204, 40. The controllers 206, 208, 42 may modify the operating parameters of the generators 200, 204, 40 to cause each of the generators 200, 204, 40 to generate an equal amount of electrical power.

Figure 10:
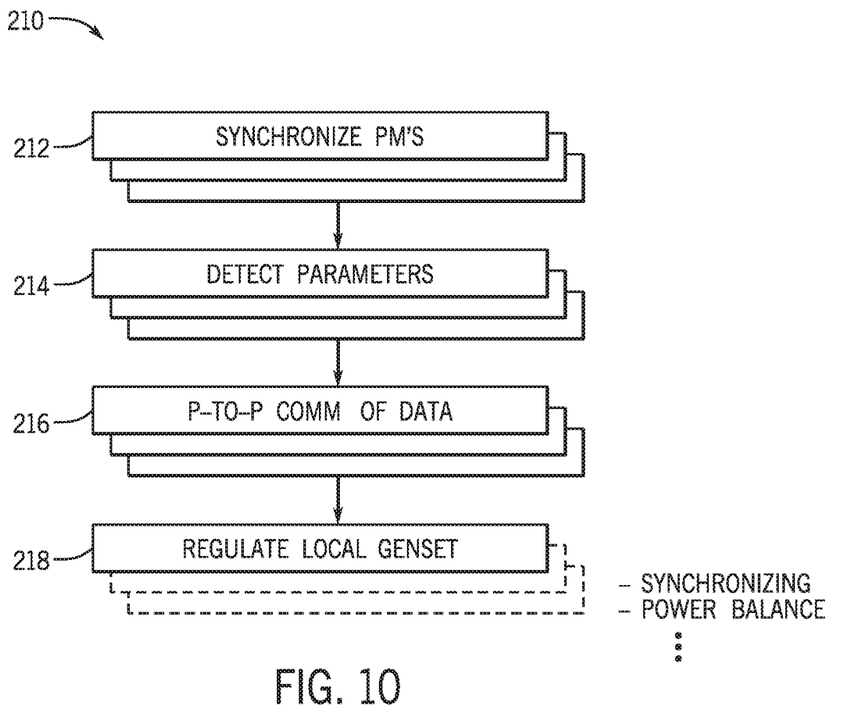
FIG. 10 is a method for synchronizing power and/or sharing loads of generators, in accordance with embodiments described herein.

Keeping the discussion of FIG. 9 in mind, FIG. 10 is a method 210 for synchronizing power and/or sharing loads of generators (e.g., generators 200, 204, 42 of the automation system 188). The method 210 may be performed by one or more processors (e.g., one or more processors of the controllers 206, 208, 42) that may receive data from power monitors (e.g., power monitors 196, 198, 202, 20).

At block 212, power monitors may be synchronized. As explained above, each power monitor may include a clock (e.g., clock 60) that allows for the synchronous collection of data regarding operating parameters of a system in which the power monitors are a part.

At block 214, the parameters of the system in which the power monitors are included may be detected. For example, the power monitors may detect, among other things, a voltage, current, power, frequency, phase sequence, phase angle, waveform at a given point in the system. More specifically, the power monitors may include sensing circuitry that allows for the parameters of the system to be measured.

At block 216, data regarding the detected parameters may be communicated via P2P communication. As explained above, the power monitors may include P2P communication circuitry that allows for the transmission and receiving of data to and from other power monitors. Additionally or alternatively, the data regarding the direction of the voltage sag event relative to the power monitors may be communicated via a network (e.g., a wired network or a wireless network). For instance, the power monitors may transmit data to another device (e.g., control and/or monitoring system 48), which may receive the synchronous data and transmit the voltage sag direction data to other power monitors. Furthermore, the power monitors may send the data regarding the detected parameters to the controllers of the system (e.g., controllers associated with generators)

At block 218, the generators may be regulated in order to synchronize the generators to one of the generators or a grid. For instance, utilizing the data regarding the detected parameters, the power monitors may determine that the generators are not synchronized. More specifically, processing circuitry of the power monitors may determine, via execution of instructions that provide a means for checking whether data is indicative of the generators being synchronized. If the power monitors determine that the generators are not synchronized, the power monitors may send commands to the controllers to modify the parameters of the generators in a manner that may cause the generators to become synchronized to one of the generators or a grid.

Similarly, at block 218, the generators may also be regulated to balance the amount of electrical power generated by each of the generators. For example, the data may be indicative of one generator producing more electrical power than the other generators. The power monitors may determine this imbalance in the amount of electrical power produced by each of the generators. The data reflective of the parameters may be sent to the controllers by the power monitors, and the controllers may change operational parameters of the generators (e.g., electrical power output) based on the received data. The controllers may modify the operating parameters of the generators to cause each of the generators to generate an equal amount of electrical power.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system comprising:
a plurality of power monitors that, in operation, monitor power parameters in an automation system at points between loads and/or power sources;
each power monitor comprising:
sensing circuitry configured to sense the power parameters;
peer-to-peer communications circuitry configured to communicate with other power monitors via peer-to-peer communication;
processing circuitry configured to analyze the power parameters in a cooperative manner based upon respective power parameters monitored by the respective power monitor and other power parameters monitored by the other power monitors communicated via peer-to-peer communication; and
network communications circuitry configured to:
communicate with automation devices via a network; and
provide generator data to at least two generator controllers for control of at least two generators based upon the analysis of the power parameters.

2. The system of claim 1, wherein each power monitor comprises a clock and a synchronization circuit configured to synchronize the clock with clocks of the other power monitors via peer-to-peer communication.

3. The system of claim 1, wherein the processing circuitry is configured to determine occurrence of a power quality event in the automation system.

4. The system of claim 3, wherein the power quality event comprises voltage sag caused by a load in the automation system.

5. The system of claim 4, wherein the processing circuitry is configured to determine a location and/or a cause of the voltage sag based upon direction data from the other power monitors coupled to the automation system.

6. The system of claim 1, wherein the processing circuitry is configured to determine an impedance between at least two power monitors coupled to the automation system based upon data from the other power monitors communicated by peer-to-peer communication.

7. The system of claim 1, wherein the generator data is based upon data shared between the power monitors via peer-to-peer communication for synchronizing the generators with one another and/or with a power grid.

8. The system of claim 1, wherein the generator data is based upon data shared between the power monitors via peer-to-peer communication for load sharing control of one or more of the generators with one another and/or a power grid.

9. A system comprising:
a power monitor that, in operation, monitors power parameters in an automation system at a point between loads and/or power sources, wherein the power monitor comprises:
sensing circuitry configured to sense the power parameters;
peer-to-peer communications circuitry configured to communicate with other power monitors via peer-to-peer communication;
processing circuitry configured to analyze the power parameters in a cooperative manner based upon respective power parameters monitored by the respective power monitor and other power parameters monitored by other power monitors communicated via peer-to-peer communication; and
network communications circuitry configured to:
communicate with automation devices via a network; and
provide generator data to at least two generator controllers for control of at least two generators based upon the analysis of the power parameters.

10. The system of claim 9, wherein the processing circuitry is configured to determine occurrence of a power quality event in the automation system and an upstream or downstream direction of the power quality event with respect to the power monitor.

11. The system of claim 10, wherein the processing circuitry is configured to determine a location and/or a cause of the power quality event based upon direction data from other power monitors coupled to the automation system.

12. The system of claim 9, wherein the processing circuitry is configured to determine an impedance between the power monitor and another power monitor coupled to the automation system based upon data from the other power monitor communicated by peer-to-peer communication.

13. The system of claim 9, wherein the power monitor detects a set of power parameters of one of the at least two generators and provides the generator data to the respective generator controller for control of the one of the at least two generators based upon data shared between the power monitor and at least one other power monitor via peer-to-peer communication for synchronizing the at least two generators with one another and/or with a power grid or for load sharing between the at least two generators.

14. A method comprising:
- monitoring power parameters in an automation system at points between loads and/or power sources via a plurality of power monitors, each power monitor comprising:
  - sensing circuitry configured to sense the power parameters;
  - peer-to-peer communications circuitry configured to communicate with other power monitors via peer-to-peer communication;
  - processing circuitry configured to analyze the power parameters in a cooperative manner based upon respective power parameters monitored by the respective power monitor and other power parameters monitored by the other power monitors communicated via peer-to-peer communication; and
  - network communications circuitry configured to communicate with automation devices via a network;
- communicating power data between the power monitors via peer-to-peer communication;
- analyzing the power parameters based upon the power data communicated between the power monitors; and
- providing generator data to at least two generator controllers for control of at least two generators based upon the analysis of the power parameters.

15. The method of claim 14, comprising determining, via the processing circuitry of at least one of the power monitors, occurrence of a power quality event in the automation system and an upstream or downstream direction of the power quality event with respect to each power monitor.

16. The method of claim 15, comprising determining, via the processing circuitry of the at least one of the power monitors, a location and/or a cause of the power quality event based upon direction data from the other power monitors coupled to the automation system.

17. The method of claim 14, comprising determining an impedance between at least two power monitors via the processing circuitry of at least one of the power monitors of the plurality of power monitors based upon data from at least one other power monitor communicated by peer-to-peer communication.

18. The method of claim 14, comprising detecting the power parameters of a generator of the automation system via at least one power monitor of the plurality of power monitors.

19. The method of claim 18, wherein the generator data is used to synchronize the at least two generators with one another and/or with a power grid, and/or for load sharing between the at least two generators.

20. The system of claim 6, wherein the processing circuitry is configured to determine:
- a first impedance between a first power monitor and a second power monitor based upon a portion of the power parameters sensed by the first power monitor and the second power monitor; and
- a second impedance between the first power monitor and a third power monitor based upon a second portion of the power parameters sensed by the first power monitor and the third power monitor.

* * * * *